United States Patent
Lee et al.

(10) Patent No.: US 8,169,244 B2
(45) Date of Patent: May 1, 2012

(54) CROSSING INPUT SIGNAL MODULATOR

(75) Inventors: Soo-Hyoung Lee, Seoul (KR); Jae-Young Shin, Yongin-si (KR)

(73) Assignee: Cesign Co., Ltd., Suwon-si (KR)

( * ) Notice: Subject to any disclaimer, the term of this patent is extended or adjusted under 35 U.S.C. 154(b) by 80 days.

(21) Appl. No.: 12/867,338

(22) PCT Filed: Feb. 9, 2009

(86) PCT No.: PCT/KR2009/000594
§ 371 (c)(1),
(2), (4) Date: Aug. 16, 2010

(87) PCT Pub. No.: WO2009/102128
PCT Pub. Date: Aug. 20, 2009

(65) Prior Publication Data
US 2010/0308889 A1    Dec. 9, 2010

(30) Foreign Application Priority Data
Feb. 12, 2008 (KR) .................. 10-2008-0012690

(51) Int. Cl.
H03K 17/92 (2006.01)
(52) U.S. Cl. ........ 327/170; 327/174; 327/178; 327/293; 455/42; 455/102; 455/146
(58) Field of Classification Search .................. 327/170, 327/178, 293; 455/42, 102, 146
See application file for complete search history.

(56) References Cited

U.S. PATENT DOCUMENTS
3,594,649 A * 7/1971 Rauch .......................... 327/101

FOREIGN PATENT DOCUMENTS

| JP | 08-168239 A | 6/1996 |
|----|-------------|--------|
| JP | 2006-081294 A | 3/2006 |
| KR | 1020060005346 A | 1/2006 |
| KR | 1020060094291 A | 8/2006 |
| KR | 1020060013204 A | 9/2006 |

OTHER PUBLICATIONS

International Search Report of Application No. PCT/KR2009/000594, dated Oct. 9, 2009.

* cited by examiner

*Primary Examiner* — Lincoln Donovan
*Assistant Examiner* — John Poos
(74) *Attorney, Agent, or Firm* — Kile Park Goekjian Reed & McManus PLLC

(57) ABSTRACT

The invention relates to a pulse width modulator, more particularly to a cross-coupled pulse width modulator. A crossing input signal modulator according to the present invention comprises: a positive path block which includes a first integrator for performing the first-order integration of feedback signals in first input and output signals and then transmitting the first-order integrated signals to a second integrator, and a second integrator for performing the second-order integration of a signal from the first integrator and a second input signal and then transmitting the second-order integrated signals; and a negative path block which includes a third integrator for performing the first-order integration of feedback signals in the second input and output signals and integration of a signal from the third integrator and the first input signal and then transmitting the second-order integrated signals. This configuration allows cross-coupling of the inputs from two integrators to generate an accurate differential pulse width modulation (PWM) single, and enables optimization of the IC implementation by adopting a feedback system that features a simplified implementation and minimal application area.

5 Claims, 1 Drawing Sheet

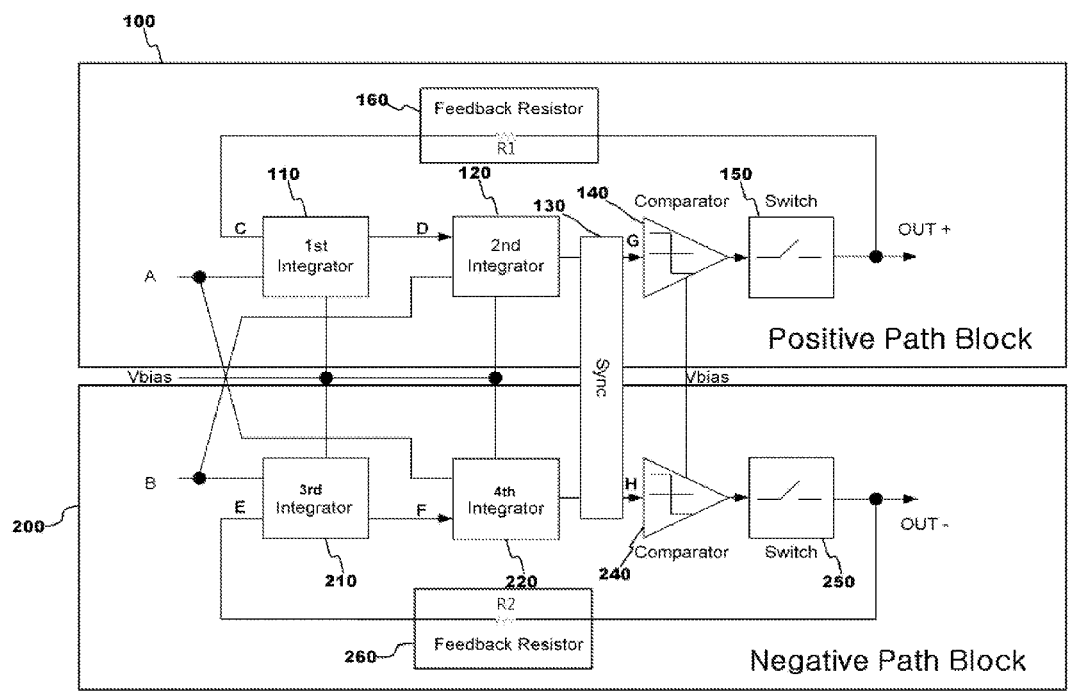

CROSSING INPUT SIGNAL MODULATOR

TECHNICAL FIELD

The present invention relates to a pulse width modulator, and more particularly to a modulator with cross-coupled input signal.

BACKGROUND ART

A pulse width modulator is a main device for an electric power conversion system, and based on a pulse width modulation (PWM) for effectively controlling conversion between DC power and an AC power.

A general energy transferring means includes a PWM converter, a switching electric power terminal, a filter and a controller. The general energy transferring means has problems of limiting a design of a system, making complex of the design, and a difficulty in designing a stable system.

In order to solve the above problems, the pulse width modulator becomes effective in embodying a system, stable and simplified through feedback (low pass filter or feedback block) of output signal of each power terminal in recent years.

However, according to the conventional technology, a signal loop is formed in a single loop to independently operate, and a synch block is used for a differential amplification, so that there in a limit in generating a differential PWM signal outputted to a load.

DISCLOSURE OF INVENTION

Technical Problem

The object of the present invention for solving the above problems is to provide a crossing input signal modulator (XCM) capable of generating an exact differential pulse width modulation (PWM) signal.

Additional object of the present invention is to provide a crossing input signal modulator (XCM) capable of simplifying a structure and minimizing in size through providing a feedback system capable of being embodied in an integrated circuit.

Technical Solution

In accordance with an aspect of the present invention, the above and other objects can be accomplished by the provision of crossing input signal modulator comprising: a positive path block comprising a first integrator firstly integrating a first input signal and a feedback signal of an output signal of the positive path block to transfer an output signal of the first integrator to a second integrator, and the second integrator secondly integrating the output signal of the first integrator and a second input signal; and a negative path block comprising a third integrator firstly integrating the second input signal and a feedback signal of an output signal of the negative path block to transfer an output signal of the third integrator to a fourth integrator, and the fourth integrator secondly integrating the output signal of the third integrator and the first input signal.

The crossing input signal modulator may further comprise a synchronization block synchronizing a carrier frequency of modulation signals of the positive block and the negative block; first comparator and second comparator comparing a bias signal with secondly integrated signals of the second integrator and fourth integrator to generate output signals, respectively; first switching block and second switching block transferring output signals of the first comparator and second comparator to loads; and first feedback block and second feedback block inputting output signals of the first switching block and second switching block to the first integrator and third integrator as a feedback.

The second input signal may be a differential signal of the first input signal.

The second input signal may be one of an analog reference signal, a specific frequency and carrier frequency.

The feedback block may include a resistor.

Advantageous Effects

According to the present invention, exact differential pulse width modulation (PWM) signal may be generated by cross-coupling inputs of two integrators, and it becomes possible to provide a crossing input signal modulator (XCM) adopting a feedback system capable of simplifying structure and minimizing a size.

Furthermore, the XCM according to the present invention may be applied to industrial fields using PWM signal such as an electric power control system, a light emitting diode system, a motor driver, etc.

BRIEF DESCRIPTION OF THE DRAWINGS

The above and other objects, features and other advantages of the present invention will be more clearly understood from the following detailed description taken in conjunction with the accompanying drawings, in which:

FIG. 1 is a block diagram illustrating a crossing input signal modulator according to an exemplary embodiment of the present invention.

MODE FOR THE INVENTION

Hereinafter, preferred embodiments of the present invention will be described in detail with reference to the annexed drawings.

FIG. 1 is a block diagram illustrating a crossing input signal modulator according to an exemplary embodiment of the present invention.

Referring to FIG. 1, a crossing input signal modulator according to the present invention includes a positive path block 100, a negative path block 200 and a synchronization block 130.

The positive path block 100 includes a first integrator 110, a second integrator 120, a first comparator 140, a first switching block 150 and a first feedback block 160. The negative path block 200 includes a third integrator 210, a fourth integrator 220, a second comparator 240, a second switching block 250 and a second feedback block 260.

The first integrator 110 receives an input signal A and a feedback signal C from the feedback block 160 and firstly integrates them to send an output thereof to the second integrator 120. The third integrator 210 receives an input signal B and a feedback signal E from the feedback block 260 and firstly integrates them to send an output thereof to the fourth integrator 120. The first integrator 110 and the third integrator 210 operates as an OP AMP-RC integrator.

The second integrator 120 secondly integrates an integration signal D of the first integrator 110 and an inversion signal B of the negative path block 200 to send an output thereof to the first comparator 140. The fourth integrator 220 secondly integrates an integration signal F of the third integrator 210 and an inversion signal A of the positive path block 100 to send an output thereof to the second comparator 240. The second and fourth integrators 120 and 220 perform integration for a self-oscillation and send outputs to comparators, respectively.

The synchronization block 130 synchronizes cross-coupled modulated signals of the positive path block 100 and the negative path block 200 with a carrier frequency. The carrier frequency is determined in loops of the positive path block 100 and the negative path block 200, and a frequency difference induced by mismatching of each loop is offseted by the synchronization block 130.

The first comparator 140 compares a bias signal Vbias and a secondly integrated signal G to send an output thereof to the first switching block 150, and the second comparator 240 compares the bias signal Vbias and a secondly integrated signal H to send an output thereof to the second switching block 250.

The first switching block 150 and the second switching block 250 outputs PWM signals from the first comparator 140 and the second comparator 240 to a load, respectively.

The first feedback block 160 and the second feedback block 260 receives the output signals to transfer an output thereof to the first integrator 110 and the third integrator 210 to form a feedback system, and the first feedback block 160 and the second feedback block 260 may include a simple resistors R1 and R2, respectively. Hereinafter, a formation and operational characteristics of the crossing input signal modulator according to the present invention will be explained in detail.

The crossing input signal modulator according to the present invention is a control system capable of being embodied by a low carrier frequency in using a distortion control technology characterized in an audio amp and a switching amp, and additionally an effective method for forming an integrated circuit in silicon is provided.

A crossing input signal modulator (XCM) and a cross-coupled modulation is provided for a full bridge tied load. The XCM is an abbreviation of a cross-coupled modulation, and named as such since the differential input signal is used through the two paths (a positive path and a negative path).

Referring to FIG. 1, the input signal A is applied to the positive path block 100, and the input signal B is applied to the negative path block 200. The input signal B is a differential signal of the input signal A. Hereinafter, the positive path block 100 is mainly explained, and an explanation of the negative path block 200 will be omitted since the operation of the negative path block 200 is similar to that of the positive path block 100.

The first integrator 110 is driven by a differential input, and receives the input signal A and an output signal C outputted from the feedback block 160 as input signals. The firstly integrated signal D outputted from the first integrator 110 is applied to the second integrator 120 as an input, which is operated by receiving a differential input, and the input signal B of the negative path block 200 is applied to the second integrator 120 as a differential input. That is, the integration signal D of the first integrator 110 and the input signal B that is a differential signal of the input signal A are applied to the second integrator 120 as a differential input.

Here, the input signal B that is a differential signal of the input signal A may be analog reference signal or a specific frequency (carrier frequency, etc.) as well as the differential signal of the input signal A.

In a single input case, even when a single input is applied as the input signal A and a reference voltage is applied as the signal B, output terminals OUT+/OUT− may output a PWM differential signal. Furthermore, when a specific frequency is desired to be used as a carrier frequency, a single input is applied as the input signal A and the specific frequency that is desired to be used as the carrier frequency is applied as the signal B to generate a PWM signal with the specific carrier frequency through the output terminal OUT+/OUT−.

The secondly integrated signal through the second integrator 120 (or the signals that are cross-coupled modulated by loops of the positive path block and the negative path block) is synchronized by one synchronization signal of the synchronization block 130. The synchronization signal may be dependent on a type of a modulator to be based on a voltage signal or a current signal. The synchronization signal may be the carrier frequency, and the secondly integrated signal is synchronized by the carrier frequency, and additionally, may be determined through the positive path block 100 and the negative path block 200. In this case, the frequency difference induced by mismatching of each loop is offseted by the synchronization block 130. Then, the signal G obtained by integrating the input signal A and the output signal of positive path block 100 which corresponds to feedback signal, is compared with a bias Vbias through the first comparator 150 to out a result. According to low level signal or a high level signal outputted by the first comparator 150, the first switching block 150 is opened or closed to output an output signal through the output terminal OUT+. Additionally, the output signal is reapplied to the first integrator 110 by the first feedback block 160 as a feedback signal.

The crossing input signal modulator according to the present invention can generate more exact differential PWM signal since each path (the positive path block and the negative path block) uses both signals of differential input (the input signals A and B, and the differential signals E and F) in case of differential PWN. Additionally, receiving output signal of two integrators connected in series as a feedback makes it possible that the feedback blocks 160 and 260 can employ only resistors R1 and R2, respectively. As a result, the feedback blocks 160 and 260 may be embodied, while simplifying structure and minimizing a size, so that integrated circuit may be effectively formed on a silicon wafer.

Furthermore, outside of the synchronization block 130 connecting two paths, information of input signal is co-owned by both paths so that mismatch of the differential signal may be minimized.

The present invention is applicable to a field using a pulse width modulation such as an electric power control system, a light emitting diode system, a motor driver, etc. Furthermore, the present invention relates to a modulator with a change of a carrier frequency in accordance with an input signal, and can reduce an electro-magnetic interference (EMI) generated when an audio amp based on the present invention is operated.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

INDUSTRIAL APPLICABILITY

The present invention may be applied to industrial fields using PWM signal such as an audio amplifier, a class D amplifier, an electric power control system, a light emitting diode system, a motor driver, etc.

What is claimed is:

1. A crossing input signal modulator, comprising:

a positive path block comprising a first integrator firstly integrating a first input signal and a feedback signal of an output signal of the positive path block to transfer an output signal of the first integrator to a second integrator, and the second integrator secondly integrating the output signal of the first integrator and a second input signal; and a negative path block comprising a third integrator firstly integrating the second input signal and a feedback signal of an output signal of the negative path block to transfer an output signal of the third integrator to a fourth integrator, and the fourth integrator secondly integrating the output signal of the third integrator and the first input signal.

2. The crossing input signal modulator of claim 1, further comprising:

a synchronization block synchronizing a carrier frequency of modulation signals of the positive block and the negative block;

first comparator and second comparator comparing a bias signal with secondly integrated signals of the second integrator and fourth integrator to generate output signals, respectively;

first switching block and second switching block transferring output signals of the first comparator and second comparator to loads; and first feedback block and second feedback block inputting output signals of the first switching block and second switching block to the first integrator and third integrator as a feedback.

3. The crossing input signal modulator of claim 2, wherein the second input signal is a differential signal of the first input signal.

4. The crossing input signal modulator of claim 2, wherein the second input signal is one of an analog reference signal, a specific frequency and carrier frequency.

5. The crossing input signal modulator of claim 2, wherein the feedback block includes a resistor.

* * * * *